United States Patent
Ogawa et al.

(10) Patent No.: US 10,061,365 B2
(45) Date of Patent: Aug. 28, 2018

(54) TEMPERATURE PREDICTION SYSTEM USING PREDICTION MODELS, TEMPERATURE PREDICTION METHOD USING PREDICTION MODELS, AND NON-TRANSITORY COMPUTER READABLE RECORDING MEDIUM HAVING THEREIN PROGRAM FOR TEMPERATURE PREDICTION USING PREDICTION MODELS

(71) Applicant: FUJITSU LIMITED, Kawasaki-shi, Kanagawa (JP)

(72) Inventors: Masatoshi Ogawa, Isehara (JP); Hiroyoshi Kodama, Isehara (JP); Hiroshi Endo, Isehara (JP); Hiroyuki Fukuda, Yokohama (JP); Masao Kondo, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 601 days.

(21) Appl. No.: 14/808,499

(22) Filed: Jul. 24, 2015

(65) Prior Publication Data

US 2016/0062340 A1 Mar. 3, 2016

(30) Foreign Application Priority Data

Aug. 28, 2014 (JP) ................................. 2014-174425

(51) Int. Cl.
*G06F 1/20* (2006.01)
*H05K 7/20* (2006.01)

(52) U.S. Cl.
CPC .......... *G06F 1/206* (2013.01); *H05K 7/20736* (2013.01); *H05K 7/20836* (2013.01); *Y02D 10/16* (2018.01)

(58) Field of Classification Search
CPC ........... H05K 7/20736; H05K 7/20836; Y02B 60/1275; Y02D 10/16; G06F 1/206; G06F 1/32
(Continued)

(56) References Cited

U.S. PATENT DOCUMENTS

| | | | | |
|---|---|---|---|---|
| 8,594,856 B2* | 11/2013 | Alon | ....................... | G06F 1/206 700/300 |
| 8,639,482 B2* | 1/2014 | Rasmussen | ............... | G06F 1/20 703/5 |

(Continued)

FOREIGN PATENT DOCUMENTS

JP 2012-251770 A1 12/2012

*Primary Examiner* — Chun Cao
(74) *Attorney, Agent, or Firm* — Kratz, Quintos & Hanson, LLP

(57) ABSTRACT

A temperature management system includes a detection unit for detecting a temperature of a heat generator, power consumption, and an intake air temperature of the electronics device; a control unit for controlling a manipulated variable to be given to the cooling device so that the temperature of the heat generator becomes close to a target value, wherein the control unit includes controllers assigned respectively to operating ranges of the electronics device and each controller includes a prediction model for predicting a future temperature of the heat generator under conditions set for the corresponding operating range, and a vector distance between a first vector for a current state of the electronic device and a second vector for conditions included in the prediction model is calculated to select the controller that corresponds to the prediction model of the shortest vector distance.

15 Claims, 11 Drawing Sheets

(58) Field of Classification Search
USPC .................................. 700/299; 713/300, 320
See application file for complete search history.

(56) References Cited

U.S. PATENT DOCUMENTS

| | | | | |
|---|---|---|---|---|
| 9,541,971 | B2* | 1/2017 | Haridass | G06F 1/206 |
| 9,671,840 | B2* | 6/2017 | Haridass | G06F 1/206 |
| 9,857,779 | B2* | 1/2018 | Varadi | G05B 13/048 |
| 2007/0067136 | A1* | 3/2007 | Conroy | G06F 1/206 |
| | | | | 702/130 |
| 2010/0179695 | A1* | 7/2010 | Collins | H05K 7/1497 |
| | | | | 700/276 |
| 2011/0306287 | A1 | 12/2011 | Takagi | |

* cited by examiner

FIG. 3
RELATED ART

| TEMPERATURE (°C) CPU UTILIZATION (%) | 10 < T ≤ 15 | 15 < T ≤ 20 | 20 < T ≤ 25 | 25 < T ≤ 30 |
|---|---|---|---|---|
| 0 < U ≤ 25 | OPERATING RANGE 1 | OPERATING RANGE 2 | OPERATING RANGE 3 | OPERATING RANGE 4 |
| 25 < U ≤ 50 | OPERATING RANGE 5 | OPERATING RANGE 6 | OPERATING RANGE 7 | OPERATING RANGE 8 |
| 50 < U ≤ 75 | OPERATING RANGE 9 | OPERATING RANGE 10 | OPERATING RANGE 11 | OPERATING RANGE 12 |
| 75 < U ≤ 100 | OPERATING RANGE 13 | OPERATING RANGE 14 | OPERATING RANGE 15 | OPERATING RANGE 16 |

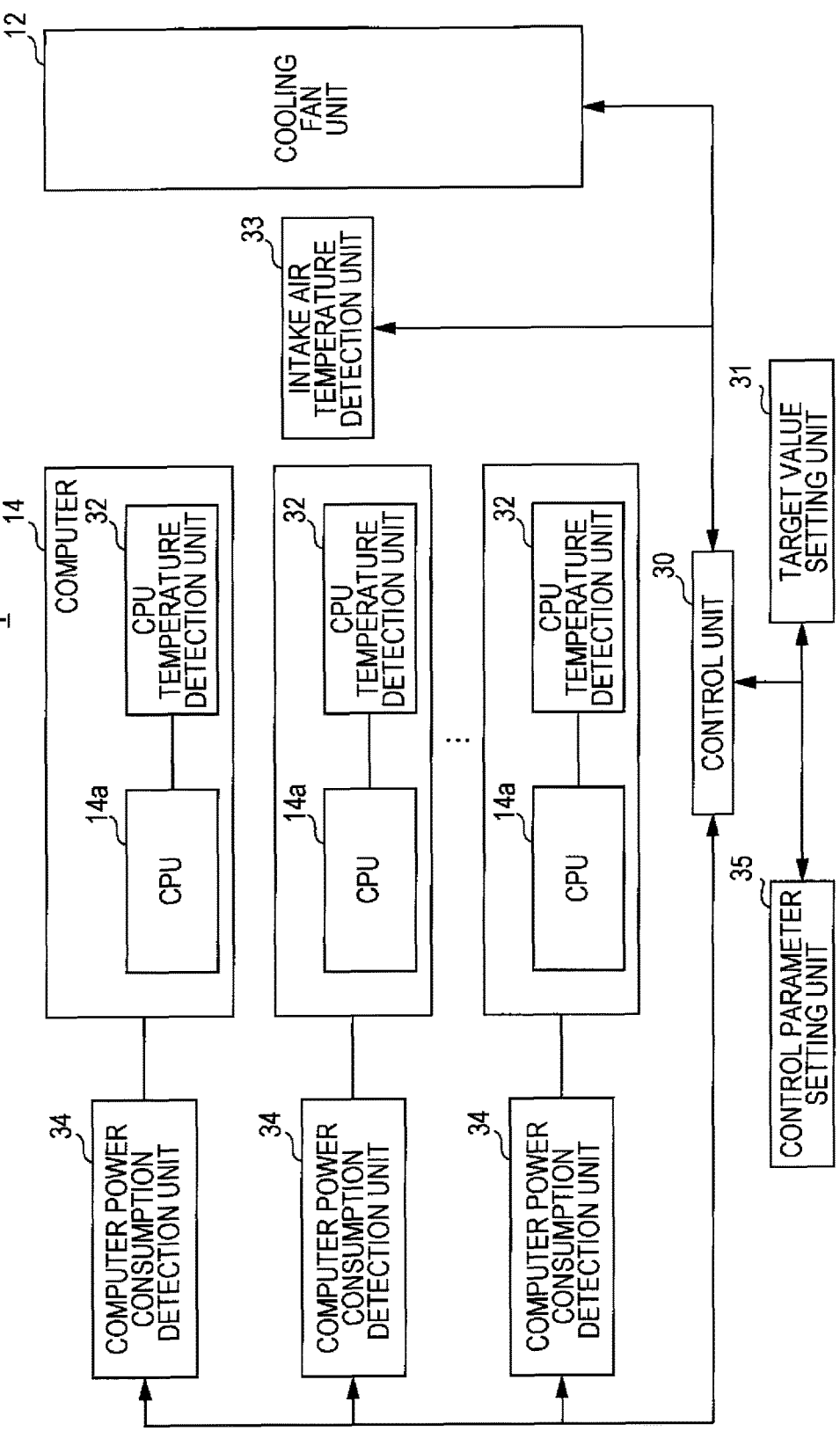

| PREDICTION MODEL No. | No. 1 | No. 2 | No. 3 | No. 4 |
|---|---|---|---|---|
| INTAKE-AIR TEMPERATURE (°C) | 20 | 30 | 30 | 20 |
| COMPUTER POWER CONSUMPTION (W) | 200 | 320 | 200 | 320 |

| CONTROLLER No. | No. 1 | No. 2 | No. 3 | No. 4 |
|---|---|---|---|---|
| ITS PREDICTION MODEL | PREDICTION MODEL No. 1 | PREDICTION MODEL No. 2 | PREDICTION MODEL No. 3 | PREDICTION MODEL No. 4 |

FIG. 11

|  | TARGET VALUE (°C) | FAN POWER CONSUMPTION AMOUNT (kW) |
|---|---|---|
| EXAMPLE | 67.95 | 978 |
| CONVENTIONAL METHOD | 67.50 | 1046 |

TEMPERATURE PREDICTION SYSTEM USING PREDICTION MODELS, TEMPERATURE PREDICTION METHOD USING PREDICTION MODELS, AND NON-TRANSITORY COMPUTER READABLE RECORDING MEDIUM HAVING THEREIN PROGRAM FOR TEMPERATURE PREDICTION USING PREDICTION MODELS

CROSS-REFERENCE TO RELATED APPLICATION

This application is based upon and claims the benefit of priority of the prior Japanese Patent Application No. 2014-174425, filed on Aug. 28, 2014, the entire contents of which are incorporated herein by reference.

FIELD

The embodiment discussed herein is related to a temperature management system, a temperature management method, and a non-transitory computer readable recording medium having therein program for temperature management.

BACKGROUND

With the advent of an advanced information society, computers have come to handle a vast amount of data, and there have been an increasing number of cases where a large number of computers are installed and managed collectively in the same room of a facility such as a data center. For example, a large number of racks (server racks) are installed in a computer room of a data center, and multiple computers (servers) are housed in each rack. A huge amount of jobs are processed efficiently by organically allocating the jobs to the computers according to the operating condition of each computer.

Computers generate a lot of heat during operation. Since temperature increase inside a computer may cause malfunction or failure of the computer, the heat generated inside the computer is exhausted to the outside of a rack by taking in cool air inside the rack using a cooling fan. In order to adjust the temperature of a heat generator (such as a CPU) of the computer to be equal to or lower than a target value, the number of rotations of the cooling fan is feedback controlled by proportional-integral-derivative (PID) control, for example.

Meanwhile, model predictive control is a control method to optimize a manipulated variable in a future interval. The model predictive control is a method of predicting a variation of a controlled variable (a CPU temperature, for example) in a predetermined prediction interval by use of a prediction model, and determining a manipulated variable so that the controlled variable may reach its target value in a desirable way. A manipulated variable is determined by evaluating a manipulated variable for each control cycle based on an evaluation function, and obtaining a manipulated variable with the highest evaluation value.

A prediction model is a model replicating the dynamic characteristics of an object to be controlled. The dynamic characteristics indicate a relationship of time series variation between a manipulated variable input into the object to be controlled and a controlled variable output from the object to be controlled. In the model predictive control, the accuracy in the reproducibility of the dynamic characteristics greatly influences the control performance. There is also proposed a solution using a nonlinear model as a prediction model used in model predictive control. However, the use of a nonlinear model includes problems such that a solution for an optimum manipulated variable is not given or calculation processing is not completed within a control time period when the prediction model is huge or complicated. Thus, a linear prediction model is generally used, and a solving method for model predictive control with a linear model has been established already.

The above-described technique is disclosed, for example, in Japanese Laid-open Patent Publication No. 2012-251770.

SUMMARY

According to an aspect of the invention, a temperature management system to perform temperature management on an electronics device, the system includes a detection unit configured to detect a temperature of a heat generator of the electronics device, power consumption of the electronics device, and an intake air temperature of the electronics device; a cooling device configured to cool the electronics device; and a control unit configured to control a manipulated variable to be given to the cooling device so that the temperature of the heat generator becomes close to a target value, the control unit including a plurality of controllers assigned respectively to a plurality of operating ranges of the electronics device, each of the plurality of controllers configured to control the manipulated variable of the cooling device for a corresponding one of the plurality of operating ranges, the plurality of operating ranges being obtained by division of an operating area of the electronics device, the operating area being a possible range for the power consumption and the intake air temperature of the electronics device, a plurality of prediction models established respectively for the plurality of operating ranges, the plurality of prediction models included respectively in the plurality of controllers, each of the plurality of prediction models configured to predict a future temperature of the heat generator under conditions of the power consumption and the intake air temperature of a corresponding one of the plurality of operating ranges, and a controller switching unit configured to select a controller of the plurality of controller, the controller using a prediction model of the prediction models, the prediction model being established under the conditions of the power consumption and the intake air temperature closest to a current operating condition of the electronics device, wherein the controller switching unit calculates a vector distance between a first vector and a second vector, the first vector having elements of current power consumption and a current intake air temperature detected by the detection unit, the second vector having elements of the power consumption and the intake air temperature being the conditions of each prediction model, and selects the controller that corresponds to the prediction model of the shortest vector distance, and the selected controller predicts the future temperature of the heat generator using the corresponding prediction model and thereby determines the manipulated variable of the cooling device based on the temperature thus predicted.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a diagram illustrating an example where an operating range that an electronics device may have is divided into multiple areas;

FIG. 5 is a diagram illustrating a configuration example of the temperature control system according to the embodiment;

FIG. 11 is a diagram illustrating an effect brought by the temperature control according to the embodiment.

DESCRIPTION OF EMBODIMENT

In the case of controlling the volume of blowing air (blast volume) and the like and managing the temperature of a heat generator by way of model predictive control using a linear prediction model, it is sometimes difficult to accurately replicate the characteristics of the entire operating area. This is because the response characteristics of a CPU temperature with respect to the air volume of a cooling fan vary largely depending on conditions such as the intake air temperature and utilization rate (rate of operation) of an electronics device. In other words, the control performance may be degraded when the actual operating condition of a computer deviates from an operating condition defined by a prediction model, and hence the control performance fluctuates depending on circumstances.

Accordingly, it is desired a temperature control technique which may suppress degradation of the control performance even when the operating condition of an electronics device varies.

Figure 1A:
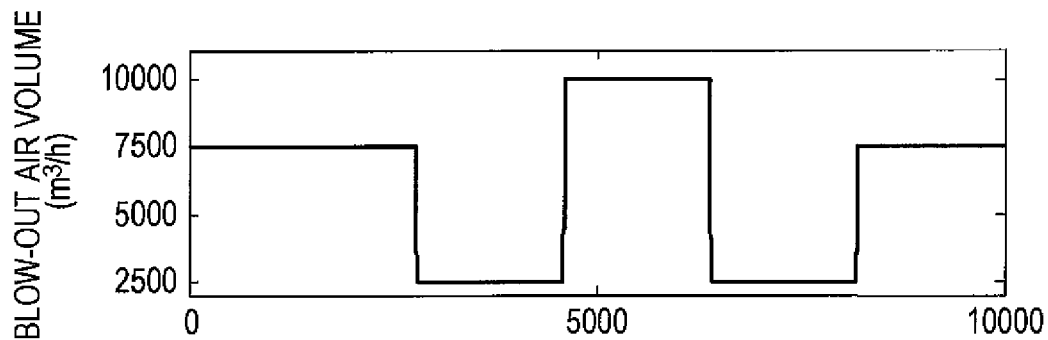
FIGS. 1A and 1B are diagrams illustrating an example of a calculation result based on a linear prediction model.
Figure 1B:
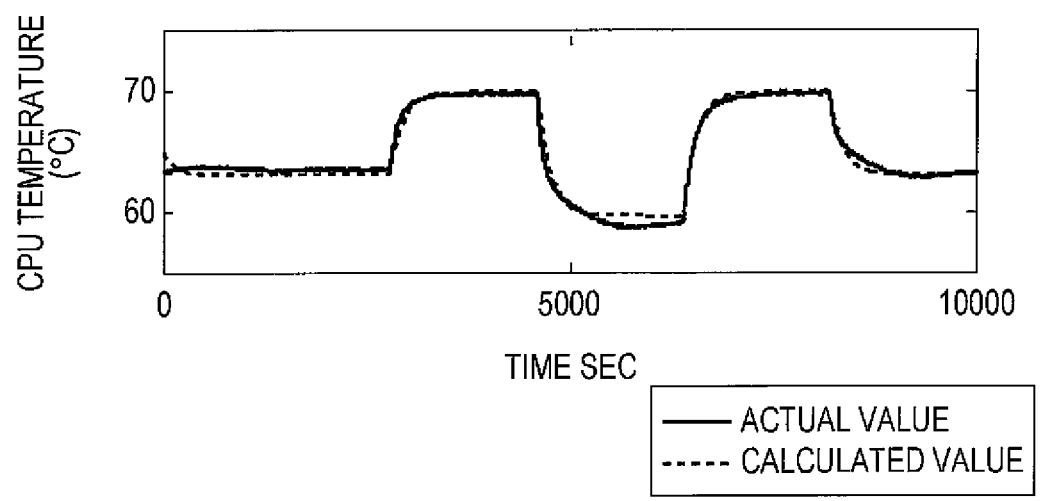
Figure 2:
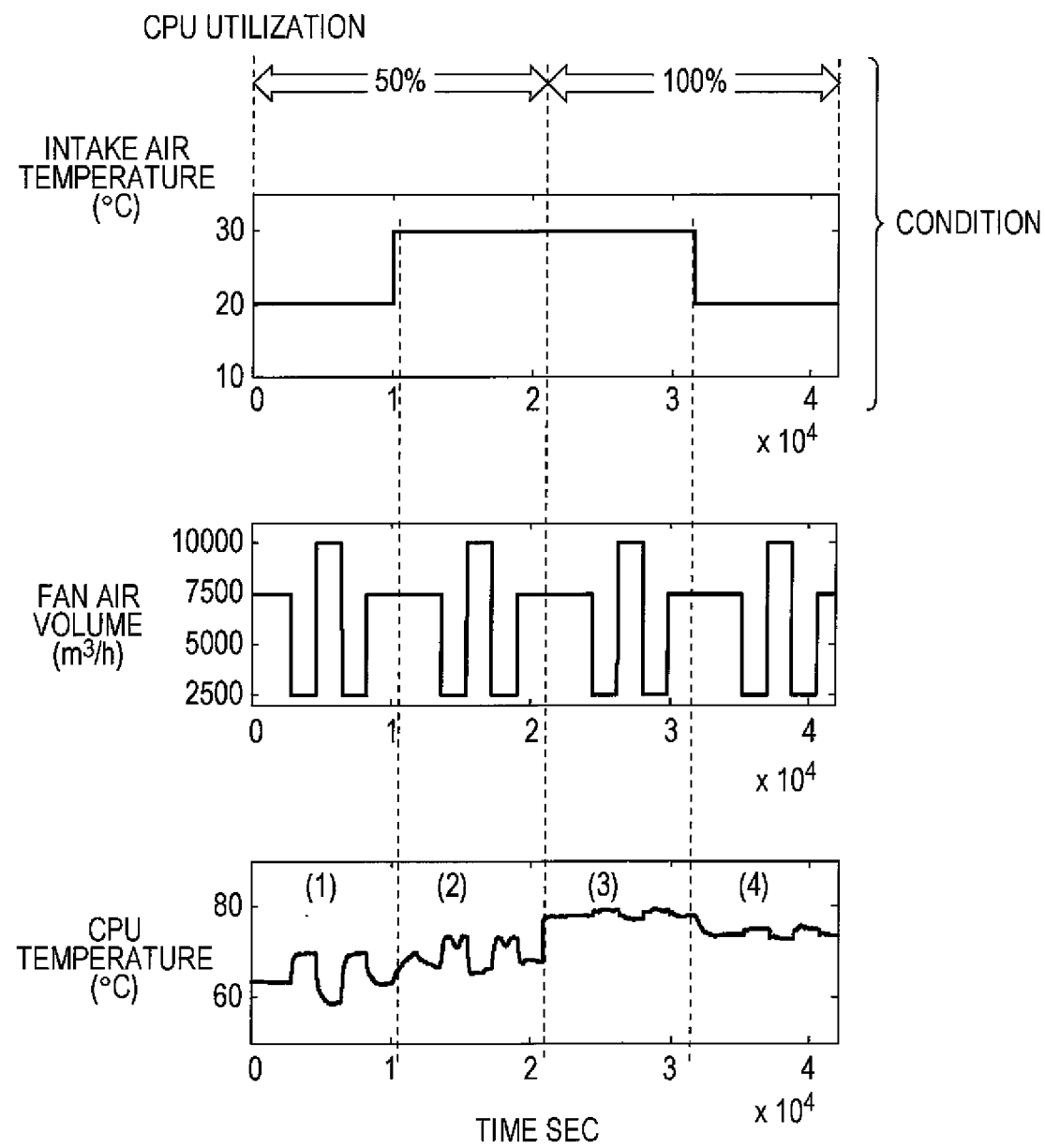
FIG. 2 is a diagram explaining a problem that may occur when model predictive control is performed using a linear prediction model.

FIGS. 1A to 2 are diagrams explaining a technical problem that may occur in general model predictive control. For example, a future variation of a CPU temperature as the controlled variable in a prediction interval is predicted using a transfer function (dynamic model), and the setting is made to the volume of air blowing from a fan (blowing air volume), which is a manipulated variable, such that it may bring a desirable control result. In the example of FIG. 1B, a CPU temperature calculated based on a prediction model is indicated with a broken line and an actual CPU temperature is indicated with a solid line. As depicted in FIG. 1B, the calculated and actual temperatures almost match each other, meaning that the prediction model well represents a CPU temperature variation. Assume that the operating condition of computers at this time is as follows: intake air temperature 20° C.; and CPU utilization 50%.

The inventors have found that a prediction model to be used is not an optimal model at all times depending on the operation condition range of computers. As illustrated in FIG. 2, the response characteristics of a CPU temperature vary largely when the conditions of the CPU utilization and intake air temperature of the computers vary.

FIG. 2 represents that, under the operation condition 1 where: the CPU utilization is 50%; and the intake air temperature is 20° C., the dynamic characteristics of a CPU temperature and fan air volume are the same as the dynamic characteristics of a CPU temperature and fan air volume calculated by the prediction model described using FIGS. 1A and 1B. However, under the operation condition 2 where: the CPU utilization is 50%; and the intake air temperature is 30° C., the dynamic characteristics of fan air volume and a CPU temperature differ from the dynamic characteristics of a CPU temperature and fan air volume calculated by the prediction model described using FIGS. 1A and 1B. Under the operation condition 3 where: the CPU utilization is 100%; and the intake air temperature is 30° C. or under the operation condition 4 where: the CPU utilization is 100%; and the intake air temperature is 20° C., the dynamic characteristics of fan air volume and a CPU temperature also differ largely from the dynamic characteristics of a CPU temperature and fan air volume calculated by the prediction model described using FIGS. 1A and 1B.

The inventors have conceived of the following solution based on the knowledge that the replicability of a prediction model is high and its control performance is high when the operating condition which a model to be used may implement (the operating condition 1 in the example of FIG. 2) is close to the operating condition of an actual electronics device, but the replicability of a prediction model is low and its control performance is low when the gap between the two conditions is large.

The solution is described below. The operating area of computers is divided into multiple operating ranges, and multiple controllers having different prediction models for their operating ranges are prepared. Then, a controller having a prediction model close to the current operating condition (environment condition) is adaptively selected and switched.

In the selection of a prediction model, a prediction model selected is one having the shortest vector distance between: a first vector having elements of a current power consumption amount and a current intake air temperature of computers; and a second vector having elements of a power consumption amount and an intake air temperature being the conditions of each model. This may reduce fluctuations in the control performance due to the variation of the operating condition, and reduce overshoot of the CPU temperature.

FIG. 3 is a diagram illustrating an example where the operating area of computers is divided into multiple operating ranges. The operating area may be divided evenly into 4 operating ranges, or may be divided evenly into 16 operating ranges as in FIG. 3. Alternatively, instead of evenly dividing the operating area into operating ranges, it is also possible to make division such that prediction models are established respectively based on experimental data obtained under randomly set operating conditions, and a neighboring range including each of these operating conditions is set as the operating range for the corresponding prediction model. In this case, the neighboring ranges (operating ranges) obtained by the division vary depending on how the operating conditions of the prediction models are scattered in the operating area, and the sizes of the operating ranges are also not uniform. The CPU utilization may be replaced with the computer power consumption since the CPU utilization and the computer power consumption correlate with each other.

Figure 4A:
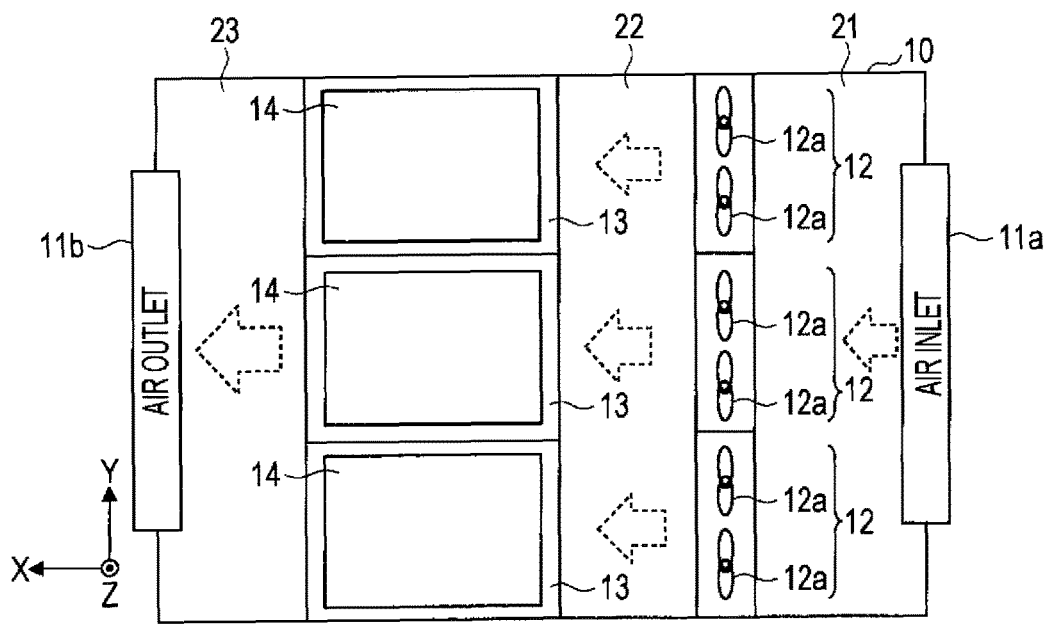
FIGS. 4A and 4B are diagrams illustrating an example of a data center in which a temperature control system according to an embodiment is employed.
Figure 4B:
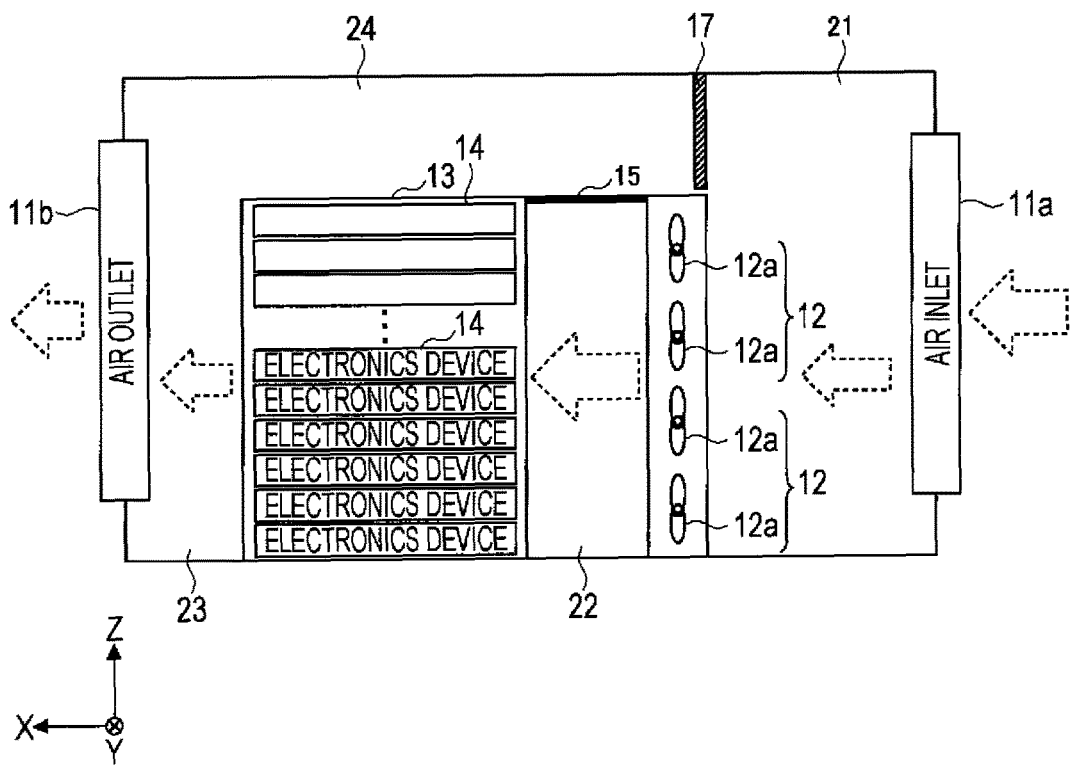

FIGS. 4A and 4B are schematic views illustrating an example of a data center in which a temperature control system according to the embodiment is employed. FIG. 4A is a top view and FIG. 4B is a side view. In this embodiment, a modular data center that cools down computers (servers) using external air is used as an example.

The modular data center illustrated in FIGS. 4A and 4B includes a container (chassis) 10 in the form of a rectangular solid, and a cooling fan units 12 and multiple racks 13 disposed in the container 10. Multiple computers 14 are housed in each rack 13.

An air inlet 11a is provided in one of two surfaces opposed to each other of the container 10, and an air outlet 11b is provided in the other surface. In addition, a partition plate 15 is disposed above a space defined by the cooling fan units 12 and the racks 13.

The cooling fan unit 12 is provided with multiple cooling fans 12a. Although not illustrated, each of the air inlet 11a and the air outlet 11b may be provided with a rainwater block plate that blocks intrusion of rainwater and an insect screen net that blocks intrusion of insects and the like.

The space inside the container 10 is divided into an external-air introduction part 21, a cold aisle 22, a hot aisle 23, and a warm air circulation path 24 by the cooling fan units 12, the racks 13, and the partition plate 15. The external-air introduction part 21 is a space defined by the air inlet 11a and the cooling fan units 12, the cold aisle 22 is a space defined by the cooling fan units 12 and the racks 13, and the hot aisle 23 is a space defined by the racks 13 and the air outlet 11b.

Each rack 13 is arranged in such a way that its surface facing the cold aisle 22 is an air inlet surface and the other surface facing the hot aisle 23 is an air outlet surface.

The warm air circulation path 24 is a space above the racks 13 and the partition plate 15, and communicates between the hot aisle 23 and the external-air introduction part 21. A damper 17 configured to adjust the amount of circulation of warm air exhausted from the racks 13 is disposed in the warm air circulation path 24.

In such a modular data center, the cooling fans 12a of the cooling fan units 12 rotate to introduce external air into the external-air introduction part 21 through the air inlet 11a. Although not illustrated, a vaporizing cooling device may be installed in the external-air introduction part 21. The vaporizing cooling device is configured to lower the temperature of introduced external air using the heat of vaporization of water when the external air temperature is high. The air introduced into the external-air introduction part 21 moves to the cold aisle 22 by way of the cooling fan unit 12, and enters each rack 13 through its air inlet surface to cool the computers 14.

The air (warm air) increased in temperature due to cooling the computers 14 is exhausted to the hot aisle 23 through the air outlet surface of each rack 13 and exhausted to the outside of the container through the air outlet 11b. When the external air temperature is high, the damper 17 is closed so that the warm air may not move from the hot aisle 23 to the external-air introduction part 21. When the external air temperature is further high, the vaporizing cooling device is supplied with water, and external air is introduced into the external-air introduction part 21 by way of the vaporizing cooling device. Since water vaporizes and draws the heat of vaporization from external air when the external air passes through the vaporizing cooling device, air of a temperature lower than the external air temperature is introduced into the external-air introduction part 21.

On the other hand, the damper 17 is opened when the external air temperature is so low that the temperature of air to be introduced into each rack 13 might be lower than the allowable minimum temperature set in advance. Thereby, the warm air partially goes back from the hot aisle 23 to the external-air introduction part 21 through the warm air circulation path 24, increasing the temperature of air to be introduced into each rack 13.

FIG. 5 is a block diagram illustrating the configuration of an electronics device temperature control system 1. The electronics device temperature control system 1 includes a control unit 30, a target value setting unit 31, CPU temperature detection units 32, the cooling fan unit 12, an intake air temperature detection unit 33, computer power consumption detection units 34, and a control parameter setting unit 35. The computers 14 are an example of electronics devices 14, and CPUs 14a are an example of heat generators.

The control unit 30 is configured to control the number of rotations of each cooling fan 12a of the cooling fan unit 12. The control unit 30 may be configured as hardware such as a microcomputer, a field-programmable gate array (FPGA), or a programmable logic controller (PLC). Alternatively, the control unit 30 may also be configured as software by preparing function of the control unit 30 as a program and loading the program into a general purpose computer.

The target value setting unit 31 is configured to set a target value of the CPU temperature. The CPU temperature detection units 32 are each a temperature sensor, for example, mounted in the chip including the CPU 14a. The data of the detected CPU temperature is transferred to the control unit 30 via a communication device (not illustrated) provided in the computer 14. The CPU temperature detection unit 32 as a temperature sensor may be disposed in close contact with a package of the CPU 14a instead of being disposed in the same chip as the CPU 14a.

The cooling fan unit 12 is a cooling device configured to cool each computer 14 including the CPU 14a. In addition to the configuration using the cooling fans 12a, the cooling fan unit 12 may also be configured by a combination of the cooling fans 12a and the vaporizing cooling device, or by a combination of the cooling fans 12a and an air conditioner.

The intake air temperature detection unit 33 is configured to measure the temperature of air to be taken in by each computer 14. The computer power consumption detection units 34 are each configured to detect the amount of power consumption of the computer 14 from a power strip to which the power plug of the computer is connected. As described above, the power consumption of the computer 14 correlate with the rate of operation of the computer 14.

The control parameter setting unit 35 is configured to set control parameters to be used in the control unit 30. Signals are exchanged between the control unit 30 and each computer 14 via user datagram protocol (UDP) communication, for example, but the way of exchanging signals is not limited to UDP communication.

Figure 6:
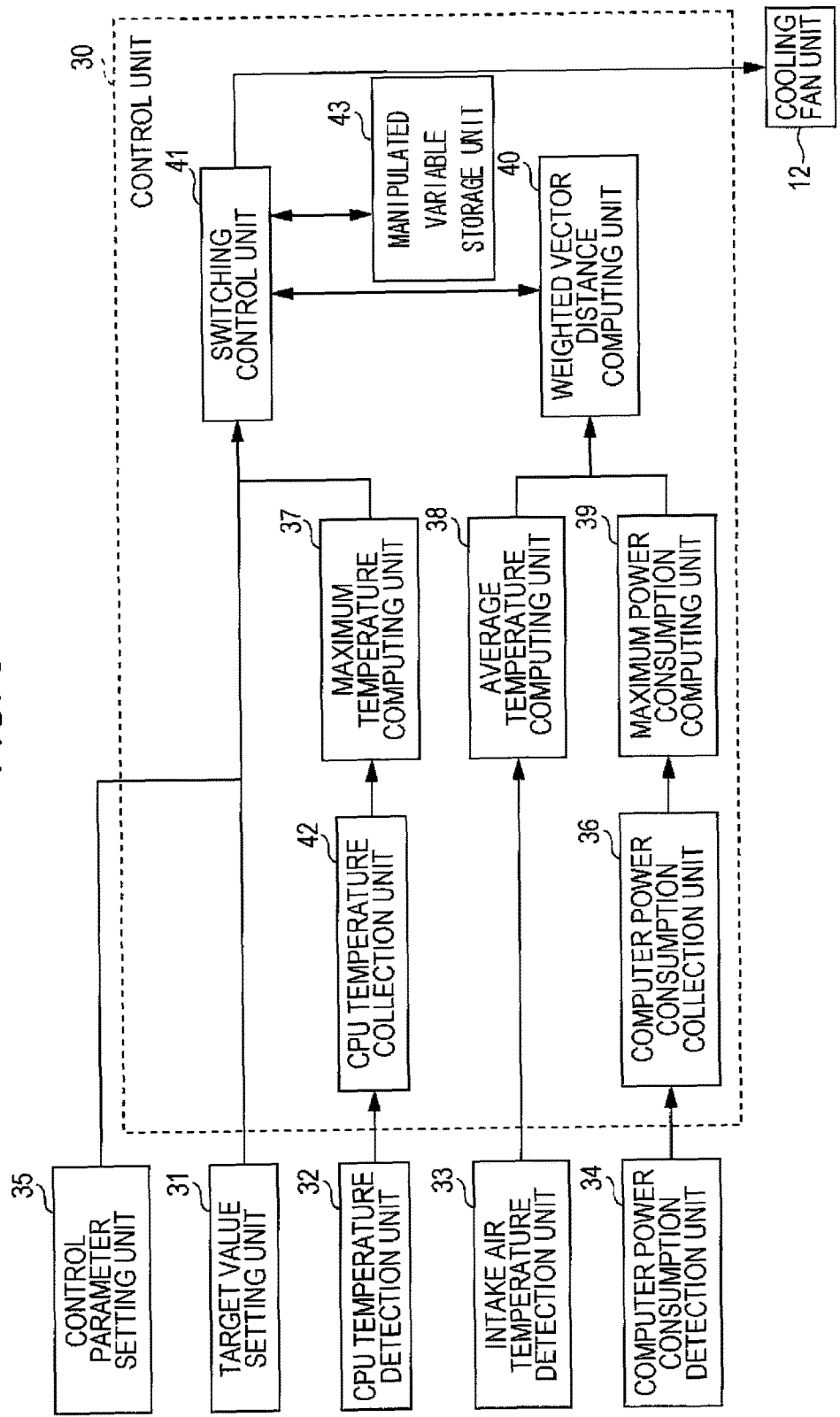
FIG. 6 is a diagram illustrating a configuration example of a control unit of the temperature control system.

FIG. 6 is a functional block diagram of the control unit 30. The control unit 30 includes a CPU temperature collection unit 42, a computer power consumption collection unit 36, a maximum temperature computing unit 37, an average temperature computing unit 38, a maximum power consumption computing unit 39, a weighted vector distance computing unit 40, a switching control unit 41, and a manipulated variable storage unit 43.

The CPU temperature collection unit 42 is configured to collect data of CPU temperatures measured by the CPU temperature detection units 32. The computer power consumption collection unit 36 is configured to collect data of computer power consumption amounts measured by the computer power consumption detection units 34. The maximum temperature computing unit 37 is configured to identify and output data of a maximum CPU temperature which is in the highest level among the CPU temperatures collected by the CPU temperature collection unit 42.

When the allowable upper limit temperature varies among the computers 14, the temperatures may be normalized by the maximum temperature computing unit 37. Several methods of the normalization are conceivable. For example, a normalized temperature $y_{nor}(\varphi)$ of a computer $\varphi$ may be obtained from an upper limit temperature $y_{lim}(\varphi)$ of the computer $\varphi$ and a minimum temperature $y_{min}(\varphi)$ of the computer $\varphi$ as in the following expression (1).

$$y_{nor}(\varphi) = \frac{y_{cur}(\varphi) - y_{min}(\varphi)}{y_{lim}(\varphi) - y_{min}(\varphi)} 100 \qquad (1)$$

The expression (1) means that the rate of approach to the upper limit temperature $y_{lim}(\varphi)$ is multiplied by 100. A highest CPU temperature $y_{cpu\_max}$ which is in the highest level may be obtained by the following expression (2).

$$y_{cpu\_max} = \max_{\psi} y_{nor}(\varphi) \qquad (2)$$

Another method of standardization is that a result of the following expression (3), where the maximum deviation between a current CPU temperature $y_{cur}(\varphi)$ and the upper limit temperature $y_{lim}(\varphi)$ of the computer $\varphi$ is multiplied by 100, is controlled so as to be equal to or lower than 100° C.

$$y_{cpu\_max} = \max_{\varphi}(y_{cur}(\varphi) - y_{lim}(\varphi)) + 100 \qquad (3)$$

The average temperature computing unit 38 is configured to collect intake air temperatures when the intake air temperature detection unit 33 measures intake air temperatures at multiple spots, and calculate and output an average value of these values.

The maximum power consumption computing unit 39 is configured to identify and output a maximum power consumption amount which is in the highest level among data of the power consumption amounts collected by the computer power consumption collection unit 36.

The weighted vector distance computing unit 40 is configured to calculate and output a weighted vector distance between: a vector having elements including a current intake air temperature output from the average temperature computing unit 38 and a current computer power consumption amount output from the maximum power consumption computing unit 39; and a vector having elements including condition values of the intake air temperature and computer power consumption amount of each prediction model held by the switching control unit 41. A method of calculating the weighted vector distance will be described later.

The switching control unit 41 is configured to divide the operating area of the computer 14, including conditions of the power consumption and the intake air temperature, into multiple operating ranges, and establish prediction models respectively for the operating ranges thus divided, the prediction models being used to estimate a future CPU temperature. The switching control unit 41 is configured to select a controller having an optimal prediction model among multiple controllers allocated for the respective prediction models and switch to the selected controller. Here, the optimal prediction model included by the selected controller is a prediction model of the shortest weighted vector distance. Each controller controls the cooling fans 12a so that a predicted CPU temperature may fall within an allowable range.

The manipulated variable storage unit 43 is configured to store the manipulated variable to be applied to the cooling fans 12a that each controller 52 has determined based on the CPU temperature predictive value.

Figure 7:
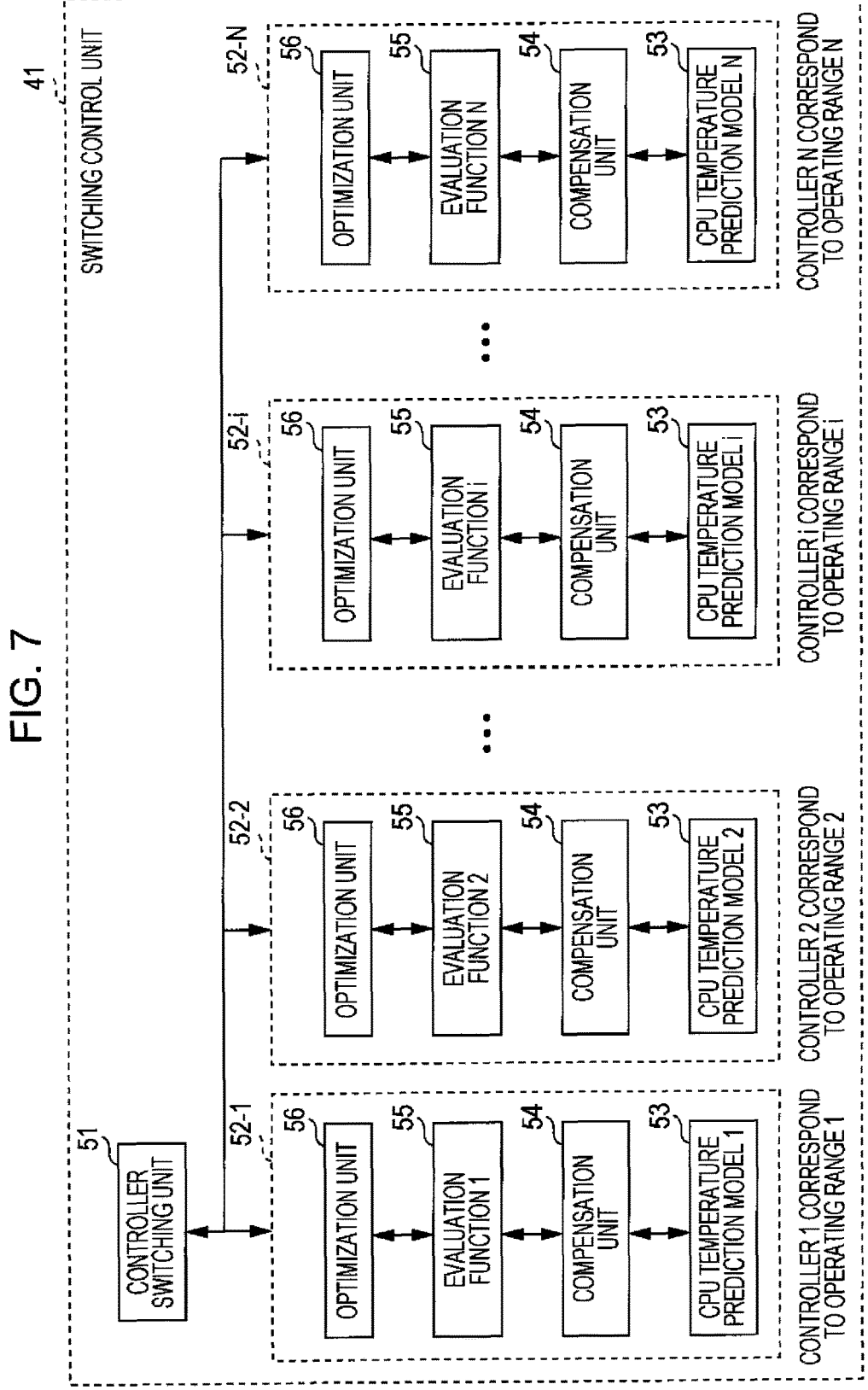
FIG. 7 is a diagram illustrating a configuration example of a switching control unit of the control unit in FIG. 6.

FIG. 7 is a functional block diagram of the switching control unit 41. The switching control unit 41 includes controllers 52-1 to 52-N (hereinafter collectively called "controllers 52" as appropriate) corresponding to the divided operating ranges 1 to N, and a controller switching unit 51 configured to switch between the controllers 52-1 to 52-N. The controller switching unit 51 identifies a CPU temperature prediction model 53 having condition values of the shortest vector distance based on the distances obtained by the weighted vector distance computing unit 40, and switches to the controller 52 having the identified CPU temperature prediction model 53. Here, priorities are given to the controllers in preparation for the case where there are multiple CPU temperature prediction models 53 having condition values of the shortest distance. When there are multiple CPU temperature prediction models 53 having condition values of the shortest distance, the controller switching unit 51 selects one controller of the highest priority among the controllers 52 including the CPU temperature prediction models 53 having condition values of the shortest distance, and switches to the selected controller.

Each controller 52 includes a CPU temperature prediction model 53 used by the controller, a compensation unit 54, an evaluation function 55, and an optimization unit 56. The controller 52 calculates a manipulated variable for the cooling fans 12a based on a future CPU temperature variation calculated using its CPU temperature prediction model 53.

The CPU temperature prediction model 53 is configured to calculate a CPU temperature predictive value from the output of the maximum temperature computing unit 37, the output of the average temperature computing unit 38, the output of the maximum power consumption computing unit 39, and the past manipulated variable for the cooling fans 12a and the current manipulated variable for the cooling fans 12a acquired from the manipulated variable storage unit 43. The compensation unit 54 is configured to compensate the predictive value thus calculated.

The evaluation function 55 is configured to calculate cost by weighting the deviation between the CPU temperature predictive value compensated by the compensation unit 54 and the target value set by the target value setting unit 31. The optimization unit 56 is configured to compute a current manipulated variable for the cooling fans 12a so that constraint conditions previously set may be satisfied and the cost (evaluation value) thus calculated may be the smallest value in a predetermined prediction interval between the present and the future. The constraint conditions will be described later. The optimization unit 56 is a calculation unit to solve an optimization problem. The optimization unit 56 does not have to be provided for each operating range (for each controller 52) as in FIG. 7, but may be shared by the multiple controllers 52.

Figure 8:
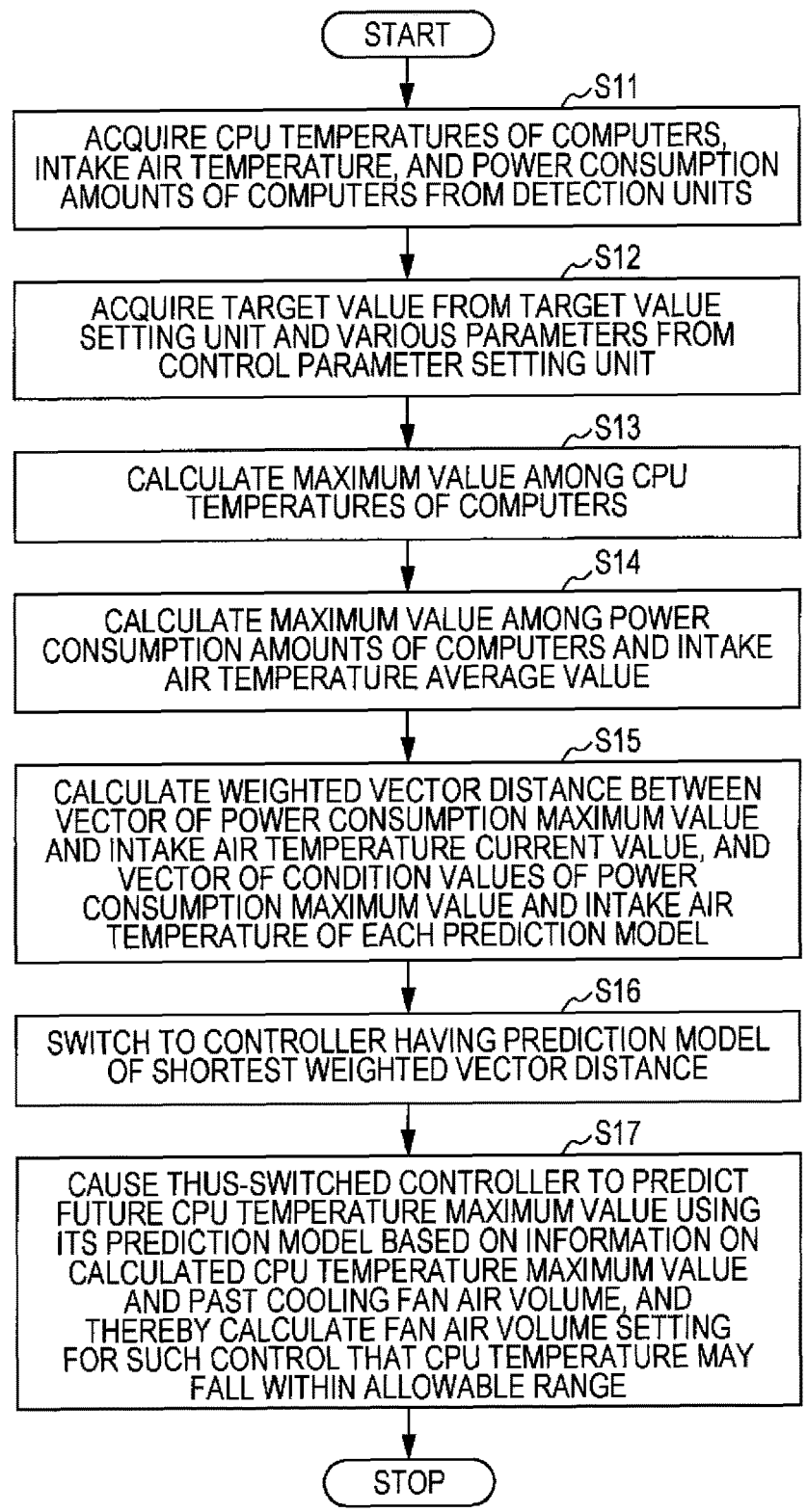
FIG. 8 is a flowchart of a temperature control method according to the embodiment.

FIG. 8 is a flowchart of a temperature control method according to the embodiment. The control unit 30 executes a processing flow of FIG. 8 per predetermined time period (per second, for example).

In step S11, the control unit 30 acquires current CPU temperatures of the computers 14 from the CPU temperature detection units 32, a current intake air temperature from the intake air temperature detection unit 33, and current power consumption amounts of the computers 14 from the computer power consumption detection units 34.

In step S12, the control unit 30 acquires a CPU temperature target value set by the target value setting unit 31 and various parameters set by the control parameter setting unit 35. The various parameters include: a target value following parameter being a weight for approximation to a target value of a cost function; a manipulated variable reducing parameter being a weight that approximates the magnitude of the manipulated variable of the cost function to 0; and a manipulated variable variation range parameter being a weight that reduces the variation range of the manipulated variable of the cost function. Steps S11 and S12 may be performed in any order.

In step S13, the maximum temperature computing unit 37 of the control unit 30 identifies and outputs a CPU temperature which is in the highest level among the CPU temperatures of the computers 14 collected by the CPU temperature collection unit 42. When the allowable upper limit temperature varies among the computers 14, the CPU temperatures are normalized using the normalization by the expressions (1) and (2) or the normalization by the expression (3), and the highest value of the obtained values is used.

In step S14, the maximum power consumption computing unit 39 of the control unit 30 identifies and outputs a power consumption amount which is in the highest level among the power consumption amounts of the computers 14 collected by the computer power consumption collection unit 36, and the average temperature computing unit 38 of the control unit 30 outputs an average value of the intake air temperatures measured at the multiple spots. Steps S13 and S14 may be performed in any order.

In step S15, the weighted vector distance computing unit 40 of the control unit 30 calculates a weighted vector distance. Specifically, using the following expression (4), the weighted vector distance computing unit 40 calculates and outputs a weighted Euclidean norm $d_y(k, \rho)$ between a vector $v_c$ and a vector $v_m$. The vector $v_c$ includes as a first element a current computer power consumption amount $v_{1\_c}$ output from the maximum power consumption computing unit 39 and as a second element a second element that is a current intake air temperature $v_m$ output from the average temperature computing unit 38. The vector $v_m$ includes a first element that is a computer power consumption amount $v_{1\_m}$ of a prediction model $\rho$ and a second element that is an intake air temperature $v_{2\_m}$ of the prediction model $\rho$, the computer power consumption amount $v_{1\_m}$ and the intake air temperature $v_{2\_m}$ being included in the set of the prediction models held by the switching control unit 41.

$$d_y(k, \rho) = \sqrt{w_1(v_{1\_m}(\rho) - v_{1\_c}(k))^2 + w_2(v_{2\_m}(\rho) - v_{2\_c}(k))^2} \quad (4)$$

Here, $w_1$ indicates a weight coefficient for the computer power consumption amount (first element) and $w_2$ indicates a weight coefficient for the intake air temperature (second element). k indicates the number of the control cycle, and $\rho$ indicates an index (element number) for the prediction model in the set of the prediction models held by the switching control unit 41.

$w_1$ and $w_2$ are determined by how much the intake air temperature and the computer power consumption contribute to the CPU temperature (rate of contribution). As the rate of contribution, one of the followings may be used, the absolute value of a correlation coefficient between the CPU temperature and the computer power consumption, the absolute value of a correlation coefficient between the CPU temperature and the intake air temperature, and an F value found by the t-test. In the case of using the correlation coefficients, for example, $w_1$ is set at 0.5 when the absolute value of the correlation coefficient between the CPU temperature and the intake air temperature is 0.5, and $w_2$ is set at 0.9 when the absolute value of the correlation coefficient between the CPU temperature and the computer power consumption is 0.9.

The control unit 30 calculates a weighted vector distance $d_y(k, \rho)$ for every prediction model held by the switching control unit 41.

In step S16, using the following expression (5), the switching control unit 41 identifies a prediction model $\rho_{min}$ having the shortest distance among the prediction models $\rho$ held by the switching control unit 41. Then, the switching control unit 41 selects a controller 52 having the prediction model $\rho_{min}$, and switches to the selected controller. When there are multiple prediction models $\rho_{min}$ having the shortest distance, the switching control unit 41 selects a controller of the highest priority among the controllers 52 having the prediction models $\rho_{min}$, and switches to the selected controller.

$$\rho_{min} = \underset{\rho}{\arg\min}\, d_y(k, \rho) \quad (5)$$

In step S17, using its CPU temperature prediction model 53 included in the controller 52 selected by the control unit 30, a model is prepared to predict a CPU temperature from the number of rotations of the cooling fans u(k) as a manipulated variable. The model is expressed by the following expression (6).

$$y(k+1) = f(u(k)) \quad (6)$$

Here, y(k+1) indicates a one-cycle-later (future) CPU temperature.

In the embodiment, a state space model expressed by the following expressions (7) and (8) is used.

$$x(k+1) = Ax(k) + B_u u(k) \quad (7)$$

$$\tilde{y}(k) = Cx(k) \quad (8)$$

Here, x(k) is called a state variable at a time point k and is an n-dimensional vector. A is an n×n matrix, $B_u$ is an n-dimensional vector, and C is an n-dimensional vector. A, $B_u$, and C may be found by system identification from previously acquired experimental data. Techniques of system identification include a prediction error technique and a subspace identification technique. Alternatively, when it is possible to derive a differential equation of a physical model describing the dynamic characteristics of a CPU temperature, A, $B_u$, and C may also be derived by linearization (Taylor expansion) of the differential equation. n is determined by the degree $n_d$ of a model and dead time $d_t$, and is expressed as $n = n_d + d_t$. In the embodiment, $d_t$ indicates dead time of the cooling fans 12a, and is set at 12 seconds.

Although the state space model is used as an example, a multiple regression model may also be employed as a model expression method.

The compensation unit 54 of the selected controller 52 compensates the gap between the actual value and the predictive value by using the following expression (9).

$$y(k+1|k)=\tilde{y}(k+1|k)+(y_{real}(k)-y(k|k-1)) \quad (9)$$

Here, $\tilde{y}(k+i|k)$ indicates a CPU temperature predictive value obtained by predicting a CPU temperature at a time point k+1 using the expressions (7) and (8) based on information available at the time point k, $y_{real}(k)$ indicates a one-cycle-earlier (past) actual measured value, and y(k|k−1) indicates a one-cycle-earlier (past) predictive value.

The optimization unit 56 of the selected controller 52 calculates a current manipulated variable which may be satisfy the constraint conditions and minimize the evaluation function 55 in a prediction interval P over a predetermined period from the present to the future. Here, dead time $d_t$ of a manipulated variable $u(k-d_t)$ is not described for the sake of clarity of the description. Using a variation Δu, a one-cycle-later (future interval) manipulated variable may be expressed as follows.

$$u(k+i|k)=u(k+i-1|k)+\Delta u(k+i|k)$$

$$(i=0, \ldots, p-1) \quad (10)$$

i is an index indicating a time in the prediction interval P. In order to evaluate a predictive value y in the prediction interval, the index i is added to each of the expressions (7) and (8) of the CPU temperature prediction model 53 and the expression (9) of the compensation unit 54. These are expressed as the following expressions (11) to (13).

$$x(k+i+1|k)=Ax(k+i|k)+B_u u(k+i|k) \quad (11)$$

$$\tilde{y}(k+i+1|k)=Cx(k+i+1|k) \quad (12)$$

$$y(k+i+1|k)=\tilde{y}(k+i+1|k)+(y_{real}(k)-y(k|k-1)) \quad (13)$$

Using the expressions (11) to (13), a variation Δu of a manipulated variable such that the constraint conditions may be satisfied and a cost function J may return the smallest value is calculated.

For example, the constraint conditions are expressed by the following expression (14).

$$y_{min} \leq y(k+i+1|k) \leq y_{max}$$

$$\Delta u_{min} \leq \Delta u(k+i|k) \leq \Delta u_{max}$$

$$u_{min} \leq u(k+i|k) \leq u_{max}$$

$$\Delta u(k+h|k)=0$$

$$(h=m, \ldots, p-1) \quad (14)$$

The cost function J is expressed by the following expression (15).

$$J(k) = \sum_{i=0}^{p-1} ([y(k+i+1|k) - r(k+i+1)]^T Q[y(k+i+1|k) - r(k+i+1)] + \Delta u(k+i|k)^T R_{\Delta u} \Delta u(k+i|k) + [u(k+i|k) - u_{target}(k+i)]^T R_u [u(k+i|k) - u_{target}(k+i)]) \quad (15)$$

An input row of the variation Δu of the manipulated variable such that the constraint conditions may be satisfied and the cost function J in the expression (15) may return the smallest value is expressed by the following expression (16).

$$\{\Delta u_{opt}(k|k), \ldots, \Delta u_{opt}(m-1+k|k)\} = \arg\min_{\Delta u(k|k),\ldots,\Delta u(m-1+k|k)} J(k) \quad (18)$$

Here, P indicates a prediction interval (prediction horizon) over a future predetermined period, m indicates an interval (control horizon) in consideration of a variation of a manipulated variable, and P≥m is satisfied. In the embodiment, P is set at 100 and m is set at 1. Q, $R_{\Delta u}$, and $R_u$ each indicate a weight matrix.

The first term of the expression (15) is an operation that approximates a controlled variable y to a target value r set by the target value setting unit 31. Q indicates a weight for an operation that approximates the controlled variable to the target value, and is the target value following parameter set by the control parameter setting unit 35. The second term is an operation that approximates the variation Δu of the manipulated variable to 0. $R_{\Delta u}$ indicates a weight for an operation that approximates the variation of the manipulated variable to zero, and is the manipulated variable reducing parameter set by the control parameter setting unit 35. The variation Δu is large when the weight $R_{\Delta u}$ is small, and the variation Δu is small when the weight $R_{\Delta u}$ is large. The third term is an operation that approximates the manipulated variable to a target manipulated variable $u_{target}$. In the embodiment, the target manipulated variable $u_{target}$ is set at 0. $R_u$ indicates a weight for an operation that approximates the manipulated variable to the target manipulated variable, and is the manipulated variable variation range parameter set by the control parameter setting unit 35.

A current manipulated variable u(k) is calculated by the following expression (17) using a head element $\Delta u_{opt}(k|k)$ extracted from the optimal input row $\{\Delta u_{opt}(k|k), \ldots, \Delta u_{opt}(m-1+k|k)\}$ found by the expression (16).

$$u(k)=u(k-1)+\Delta u_{opt}(k|k) \quad (17)$$

As an optimization solver allowing the cost function J to return the smallest value, metaheuristic solution approaches searching an approximate solution such as a genetic algorithm (GA) and particle swarm optimization (PSO) may be employed; however, in the embodiment, sequential quadratic programming (SQP) for solving a quadratic programming problem is employed.

The current manipulated variable u(k) of the expression (17) calculated by the switched controller is substituted into the expression (7) which corresponds to the prediction model held by every controller 52 and into the expression (7) in the expression (8), and the expression (8) is calculated. The controller thereby updates a state amount x(k+1) and a predictive value $\tilde{y}(k)$ included in the prediction model of each controller 52.

As described above, according to the embodiment, the control unit selects a controller having a prediction model whose operating condition is closest to the current operating condition based on a weighted vector distance between: a vector having elements of a current power consumption amount and a current intake air temperature of computers; and a vector having elements of a power consumption amount and an intake air temperature being condition values of each prediction model. By adaptively switching between the controllers having the respective prediction models, it is possible to control cooling fans and manage the temperatures of computers without degradation of the control performance even when the computers are in an operating range that a single linear prediction model is not able to cover well.

Figures 9A, 9B, 9C:
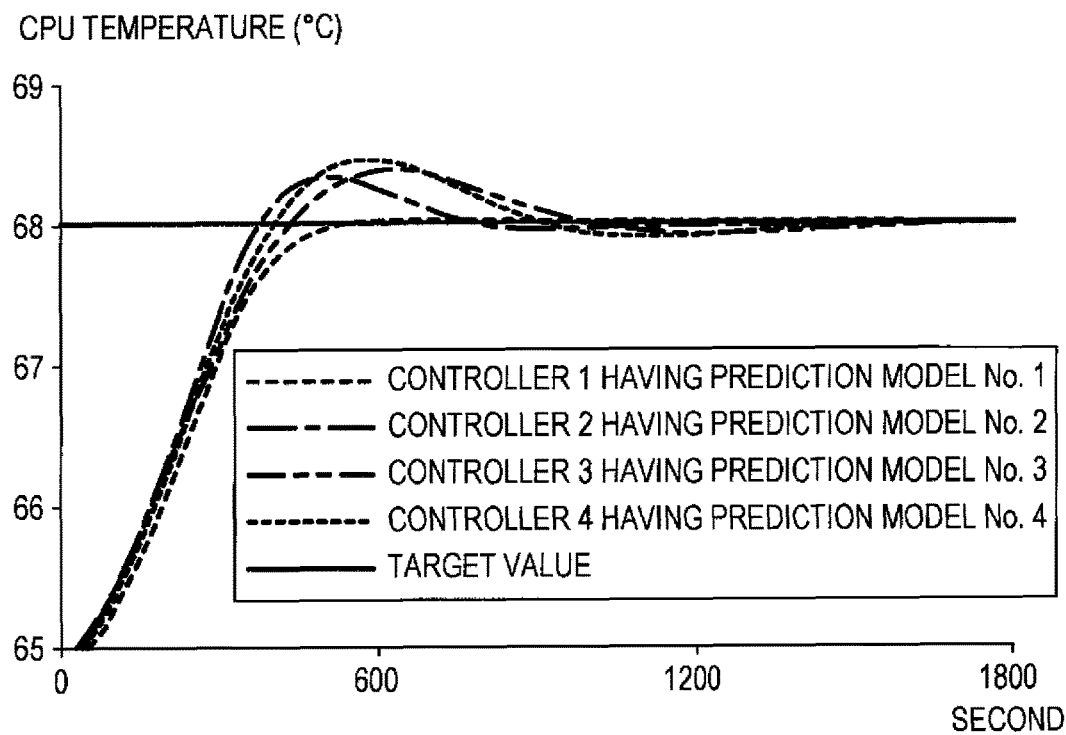
FIGS. 9A to 9C are diagrams illustrating a result of the control according to the embodiment.

FIGS. 9A to 9C are diagrams illustrating a result of the control according to the technique of the embodiment. FIG. 9A illustrates an example of prediction models that correspond to conditions representing the divided ranges. FIG. 9B illustrates an example of controllers having the prediction models. FIG. 9C is a diagram illustrating a comparison between: CPU temperature control by a controller 1 selected by the method according to the embodiment and having an optimal prediction model; and temperature control by each of controllers 2 to 4 having prediction models for operating ranges different from the current operating condition.

The intake air temperature operating range is divided into 2 and the divided ranges are represented by two typical conditions of 20° C. and 30° C., and the computer power consumption operating range is divided into 2 and the divided ranges are represented by two typical conditions of 200 W and 320 W in order to create the following four prediction models: (1) a prediction model No. 1 having conditions of an intake air temperature of 20° C. and a computer power consumption amount of 200 W; (2) a prediction model No. 2 having conditions of an intake air temperature of 30° C. and a computer power consumption amount of 320 W; (3) a prediction model No. 3 having conditions of an intake air temperature of 30° C. and a computer power consumption amount of 200 W; and (4) a prediction model No. 4 having conditions of an intake air temperature of 20° C. and a computer power consumption amount of 320 W.

Then, a controller having the prediction model No. 1 is set as a controller No. 1, a controller having the prediction model No. 2 is set as a controller No. 2, a controller having the prediction model No. 3 is set as a controller No. 3, and a controller having the prediction model No. 4 is set as a controller No. 4.

The four controllers described above perform control with the intake air temperature set at 20° C. and the computer power consumption amount set at 200 W as the operating conditions of computers. Since the correlation coefficient between the computer power consumption and the CPU temperature is 0.9 and the correlation coefficient between the intake air temperature and the CPU temperature is 0.5, the weight coefficient $w_1$ for the computer power consumption amount (the first element of the vector) in the expression (4) is set at 0.9 and the weight coefficient $w_2$ for the intake air temperature (the second element of the vector) is set at 0.5. Besides, a target value of the CPU temperature is set at 68° C.

A weighted vector distance between: a vector having elements of the current intake air temperature and the current computer power consumption amounts acquired from the detection units; and a vector having elements of the condition values of each of the prediction models No. 1 to No. 4 held by the corresponding controller was calculated using the method according to the embodiment. As a result, the model No. 1 was selected.

In FIG. 9B, one broken line indicates a variation of the CPU temperature controlled by the controller No. 1 having the model No. 1. In the case of using the selected controller No. 1, the current condition and the condition of its prediction model match each other. Accordingly, the controller No. 1 may perform control with high response without overshoot of the CPU temperature, that is, performs temperature management without an excessive increase of the CPU temperature. In contrast, in the case of using each of the controllers No. 2 to No. 4, the operating condition represented by its prediction model deviates from the current condition and thus overshoot occurs.

Since the weighted vector distance is employed in the embodiment, it is possible to uniquely determine a controller by the equation (4) adopting the weight coefficients even when a value of the current condition is equal to a boundary value of any of the divided operating ranges (a current intake air temperature of 25° C. or a current computer power consumption amount of 260 W, for example).

Figure 10A:
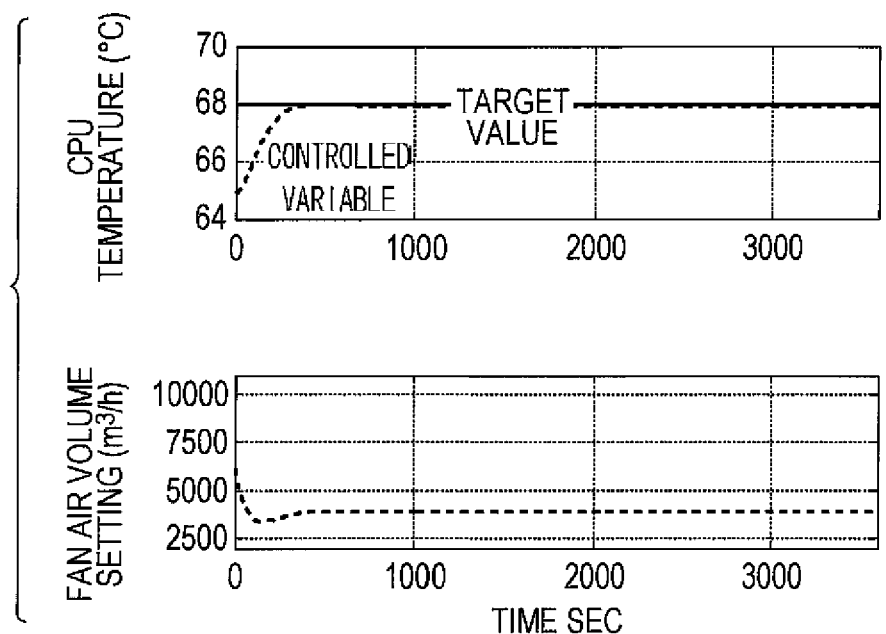
FIGS. 10A and 10B are diagrams illustrating a comparison between the amount of power consumption according to the temperature control of the embodiment and that according to a conventional method.
Figure 10B:
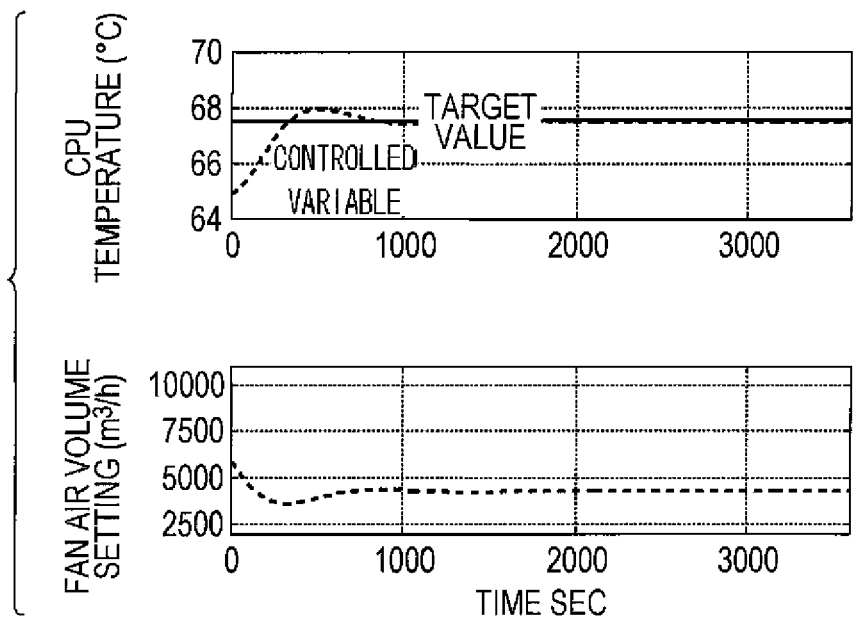

FIGS. 10A to 11 are diagrams illustrating a comparison between the method according to the embodiment and the conventional method in terms of the effect of the saving of the power consumption of the cooling fans 12a. FIGS. 10A to 11 illustrate an example of the case of performing such control that the CPU temperatures of the computers 14 may not exceed 68° C.

The target value is previously set lower than actually desired in consideration of overshoot so that the CPU temperature may not exceed the target value actually desired. In the case of using the temperature management method according to the embodiment, the target value may be set at 67.95° C. because overshoot rarely occurs as illustrated in FIG. 10A. In other words, the blowing air volume of the cooling fans 12a may be reduced because the volume of air for cooling is reduced. The amount of power consumption of the cooling fans 12a in this case is 978 Wh.

On the other hand, in the case where the controller No. 4 having the prediction model whose operating condition is different from the actual operating condition controls the cooling fans 12a, the target value has to be set at 67.5° C. in consideration of overshoot. Thus, the volume of air requested to cool the computers 14 is increased, and the amount of power consumption of the cooling fans 12a in this case is 1046 Wh.

The comparison result described above is summarized in FIG. 11. According to the embodiment, it is possible to reduce power by approximately 6.5% by selecting a controller having a prediction model whose operating condition is closest to the current operating condition of the computers. While the target temperature is previously set lower in consideration of overshoot according to the conventional method, the target value may be set near the allowable upper limit temperature for the CPU according to the method of the embodiment, thereby enabling a reduction of the power consumption of the cooling fans 12a.

The temperature management on electronics devices according to the embodiment may be implemented by a computer program. In this case, a program is installed in a control computer, the program causing the computer to execute a procedure including processes of: (a) collecting a temperature of a heat generator of an electronics device, power consumption of the electronics device, and an intake air temperature of the electronics device that are detected by a detection unit; (b) assigning multiple controllers respectively to multiple operating ranges of the electronics device that are obtained by division of an operating area of the electronics device being a possible range for the power consumption and the intake air temperature of the electronics device, the controllers configured to control a manipulated variable to be given to a cooling device; (c) establishing multiple prediction models for the operating ranges so that the prediction models correspond to the controllers, respectively, the prediction models each configured to predict a future temperature of the heat generator under conditions of the power consumption and the intake air temperature of the corresponding operating range; (d) switching to a controller using a prediction model out of the prediction models that is established for the operating range closest to a current operating condition of the electronics device, the switching including calculating a vector distance between a first vector having elements of current power consumption and a current intake air temperature and a second vector having elements of the power consumption and the intake air temperature being the conditions of each prediction model, and switching to the controller that corresponds to the prediction model of the shortest vector distance; and (e) causing the switched controller to predict the future temperature of the heat generator and thereby determine the manipulated variable of the cooling device based on the temperature thus predicted.

The use of the temperature management program described above makes it possible to suppress degradation of the control performance even in an environment where the operating condition of electronics devices varies, to perform control to keep the CPU temperature at or near the target temperature while suppressing overshoot at the time of temperature control on electronics devices, and to reduce power consumption of a cooling device used for the temperature control.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A temperature management system to perform temperature management on an electronics device, the system comprising:
   a detector configured to detect a temperature of a heat generator of the electronics device, power consumption of the electronics device, and an intake air temperature of the electronics device;
   a cooling device configured to cool the electronics device; and
   a processor configured to control a manipulated variable to be given to the cooling device so that the temperature of the heat generator becomes close to a target value, the processor:
   controls the manipulated variable of the cooling device for a corresponding one of a plurality of operating ranges of the electronics device which are obtained by division of an operating area of the electronics device, the operating area being a possible range for the power consumption and the intake air temperature of the electronics device,
   establishes a plurality of prediction models which are respectively for the plurality of operating ranges and each predicts a future temperature of the heat generator under conditions of the power consumption and the intake air temperature of a corresponding one of the plurality of operating ranges,
   selects, from among the plurality of prediction models, a prediction model which is established under the conditions of the power consumption and the intake air temperature closest to a current operating condition of the electronics device by calculating a vector distance between a first vector having elements of current power consumption and a current intake air temperature detected by the detector and a second vector having elements of the power consumption and the intake air temperature being the conditions of each prediction model, and selecting the prediction model of the shortest vector distance
   predicts the future temperature of the heat generator using the corresponding prediction model and
   determines the manipulated variable of the cooling device based on the predicted temperature.

2. The temperature management system according to claim 1, wherein the processor calculates the vector distance as a weighted Euclidean norm by using a first weight coefficient for the power consumption and a second weight coefficient for the intake air temperature.

3. The temperature management system according to claim 2, wherein the first weight coefficient is determined by how much the power consumption contributes to the temperature of the heat generator and the second weight coefficient is determined by how much the intake air temperature contributes to the temperature of the heat generator.

4. The temperature management system according to claim 1, wherein, when the cooling device cools a plurality of electronics devices having different allowable upper limit temperatures, the processor normalizes current temperatures of a plurality of heat generators of the electronics devices which are detected by the detector and uses, as the temperature of the heat generators, a maximum temperature among the normalized temperatures of the heat generators.

5. The temperature management system according to claim 1, wherein the cooling device is a cooling fan, and the processor controls any one of the number of rotations of the cooling fan and a volume of air blowing from the cooling fan so that the temperature of the heat generator becomes close to the target value.

6. A temperature management method of performing temperature management on an electronics device, the method comprising:
   detecting a temperature of a heat generator of the electronics device, power consumption of the electronics device, and an intake air temperature of the electronics device; and
   controlling a manipulated variable to be given to a cooling device so that the temperature of the heat generator becomes close to a target value, the cooling device configured to cool the heat generator, the controlling including
   dividing an operating area of the electronics device into a plurality of operating ranges, the operating area being a possible range for the power consumption and the intake air temperature of the electronics device, assigning a plurality of controllers respectively to the operating ranges, the controllers configured to control the manipulated variable of the cooling device,
   establishing a plurality of prediction models for the operating ranges so that the prediction models correspond to the controllers, respectively, the prediction models each configured to predict a future temperature of the heat generator under conditions of the power consumption and the intake air temperature of the corresponding operating range,
   calculating a vector distance between a first vector having elements of detected current power consumption and current intake air temperature and a second vector having elements of the power consumption and the intake air temperature being the conditions of each prediction model, selecting one of the controllers that corresponds to the prediction model of the shortest vector distance, and causing the selected controller to predict the future temperature of the heat generator and thereby determine the manipulated variable of the cooling device based on the temperature thus predicted.

7. A non-transitory computer readable recording medium having therein a program for causing a computer to execute a process for temperature management on an electronics device, the process comprising:

collecting a temperature of a heat generator of an electronics device, power consumption of the electronics device, and an intake air temperature of the electronics device that are detected by a detector;

assigning a plurality of controllers respectively to a plurality of operating ranges of the electronics device that are obtained by division of an operating area of the electronics device being a possible range for the power consumption and the intake air temperature of the electronics device, the controllers configured to control a manipulated variable to be given to a cooling device;

establishing a plurality of prediction models for the operating ranges so that the prediction models correspond to the controllers, respectively, the prediction models each configured to predict a future temperature of the heat generator under conditions of the power consumption and the intake air temperature of the corresponding operating range;

switching to a controller using a prediction model out of the prediction models that is established for the operating range closest to a current operating condition of the electronics device, the switching including calculating a vector distance between a first vector having elements of current power consumption and a current intake air temperature and a second vector having elements of the power consumption and the intake air temperature being the conditions of each prediction model, and switching to the controller that corresponds to the prediction model of the shortest vector distance; and causing the switched controller to predict the future temperature of the heat generator and thereby determine the manipulated variable of the cooling device based on the temperature thus predicted.

8. The temperature management method according to claim 6, wherein the vector distance is calculated as a weighted Euclidean norm by using a first weight coefficient for the power consumption and a second weight coefficient for the intake air temperature.

9. The temperature management method according to claim 8, wherein the first weight coefficient is determined by how much the power consumption contributes to the temperature of the heat generator and the second weight coefficient is determined by how much the intake air temperature contributes to the temperature of the heat generator.

10. The temperature management method according to claim 6, wherein, when the cooling device cools a plurality of electronics devices having different allowable upper limit temperatures, current temperatures of a plurality of heat generators of the electronics devices which are detected are normalized and a maximum temperature among the normalized temperatures of the heat generators is used as the temperature of the heat generators.

11. The temperature management method according to claim 6, wherein the cooling device is a cooling fan, and any one of the number of rotations of the cooling fan and a volume of air blowing from the cooling fan is controlled so that the temperature of the heat generator becomes close to the target value.

12. The non-transitory computer readable recording medium according to claim 7, wherein the vector distance is calculated as a weighted Euclidean norm by using a first weight coefficient for the power consumption and a second weight coefficient for the intake air temperature.

13. The non-transitory computer readable recording medium according to claim 12, wherein the first weight coefficient is determined by how much the power consumption contributes to the temperature of the heat generator and the second weight coefficient is determined by how much the intake air temperature contributes to the temperature of the heat generator.

14. The non-transitory computer readable recording medium according to claim 7, wherein, when the cooling device cools a plurality of electronics devices having different allowable upper limit temperatures, current temperatures of a plurality of heat generators of the electronics devices which are detected are normalized and a maximum temperature among the normalized temperatures of the heat generators is used as the temperature of the heat generators.

15. The non-transitory computer readable recording medium according to claim 7, wherein the cooling device is a cooling fan, and any one of the number of rotations of the cooling fan and a volume of air blowing from the cooling fan is controlled so that the temperature of the heat generator becomes close to the target value.

* * * * *